United States Patent [19]

Shah

[11] Patent Number: 5,652,732

[45] Date of Patent: Jul. 29, 1997

[54] APPARATUS AND METHOD FOR MATCHING A CLOCK DELAY TO A DELAY THROUGH A MEMORY ARRAY

[75] Inventor: Shailesh Shah, San Jose, Calif.

[73] Assignee: Cypress Semiconductor Corp., San Jose, Calif.

[21] Appl. No.: 577,716

[22] Filed: Dec. 22, 1995

[51] Int. Cl.$^6$ .................................................. G11C 8/00
[52] U.S. Cl. ........................... 365/233; 365/194; 365/210
[58] Field of Search .................................. 365/233, 194, 365/210

[56] References Cited

U.S. PATENT DOCUMENTS

| | | |
|---|---|---|
| 5,327,394 | 7/1994 | Green et al. ............................ 365/233 |
| 5,343,438 | 8/1994 | Choi et al. ............................. 365/233 |
| 5,438,548 | 8/1995 | Houston ................................. 365/233 |
| 5,455,802 | 10/1995 | McClure ................................. 365/233 |

*Primary Examiner*—Son T. Dinh
*Attorney, Agent, or Firm*—Blakely, Sokoloff, Taylor & Zafman LLP

[57] ABSTRACT

A memory device including a memory array and a series of sense amplifiers coupled to the memory array. The memory array includes numerous memory cells. A clock transmission line receives a clock signal and forms a clock word line within the memory device. A circuit is coupled to the clock transmission line and includes at least one transistor device coupled to the clock transmission line to receive the clock signal. The circuit also includes a clock output coupled to one of the sense amplifiers.

21 Claims, 8 Drawing Sheets

APPARATUS AND METHOD FOR MATCHING A CLOCK DELAY TO A DELAY THROUGH A MEMORY ARRAY

BACKGROUND OF THE INVENTION

1. Field of the Invention

The present invention relates to memory devices. More specifically, matching a clock signal delay to a delay through a memory array.

2. Background

Memory devices typically contain a memory array having a series of memory cells arranged in rows and columns. Additional control circuitry is connected to the memory array to control the storage of the information in the memory array as well as retrieval of information from the array. Each row of memory cells in the memory array has an associated word line. Each column of memory cells in the memory array has an associated bit line. A particular memory cell within the array is selected by activating the corresponding word line and bit line. The memory cell data is provided on the bit line to a sense amplifier which amplifies the signal and provides the data output.

A clock signal is used to activate the sense amplifier. The sense amplifier cannot be activated by the clock signal until the data from the memory cell is available at the sense amplifier input. If the sense amplifier is activated too early, invalid data may be received by the sense amplifier and provided at the output. When a particular word line is activated, a signal must propagate across the word line to the selected memory cell. Another time period is required to activate the memory cell itself and copy the memory cell data onto the bit line. Therefore, the clock signal to activate the sense amplifiers must be delayed while the word line signal propagates across the word line and data is provided on the bit line.

Figure 1:
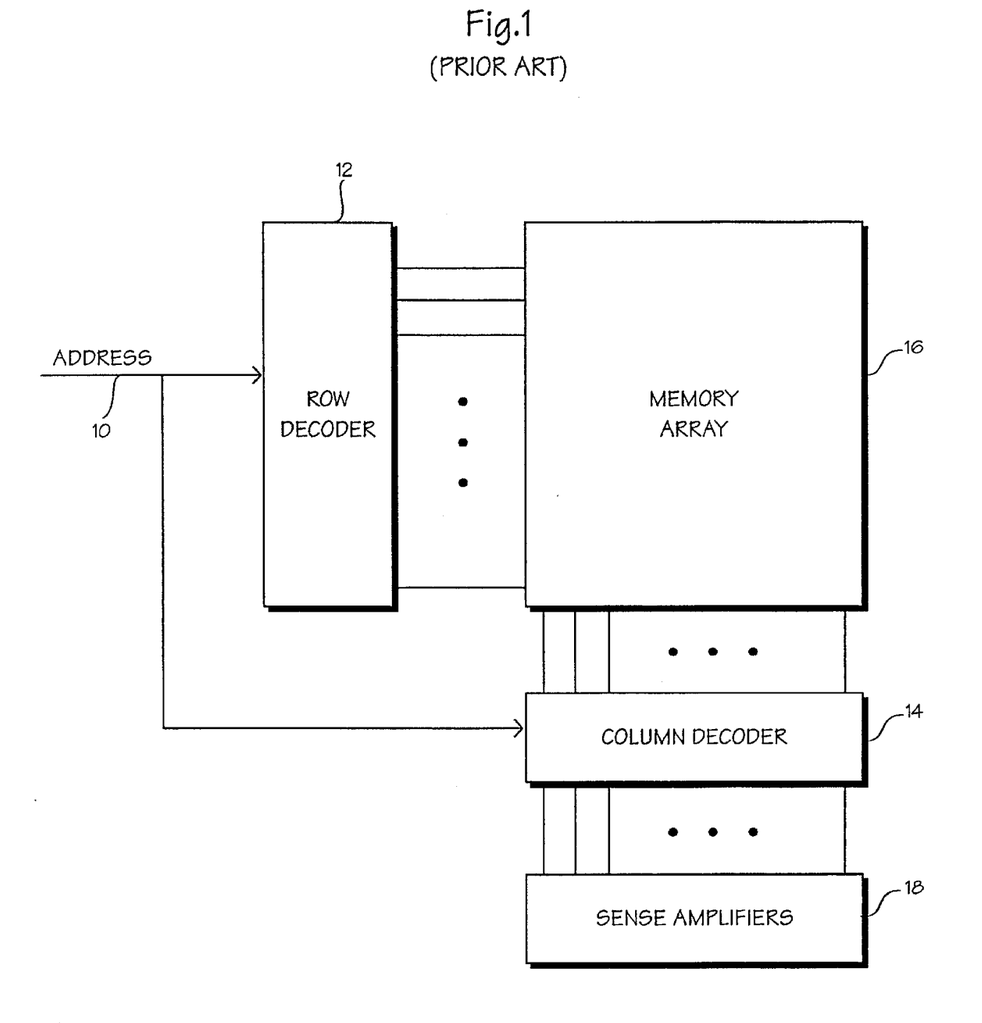
FIG. 1 is a block diagram of a conventional memory device.

FIG. 1 illustrates a block diagram of a conventional memory device having a row decoder 12 and a column decoder 14, each of which receive a memory address on address line 10. Row decoder 12 selects a particular word line within a memory array 16 based on the memory address provided. Similarly, column decoder 14 selects a particular column within memory array 16 based on the memory address provided. A plurality of sense amplifiers 18 are connected to the column decoder and receive the data from the selected memory cell.

Figure 2:
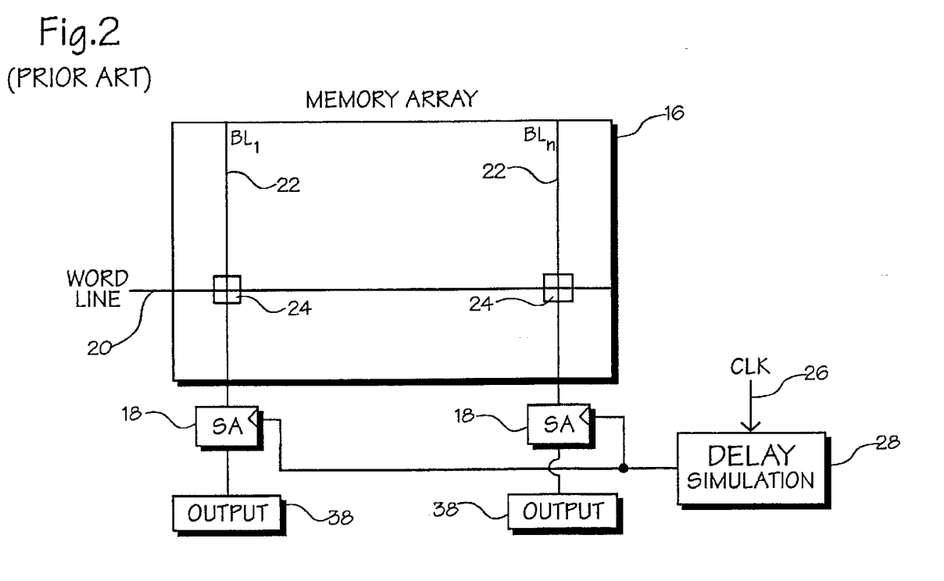
FIG. 2 is a prior art circuit for delaying a clock signal used to activate a series of sense amplifiers.

FIG. 2 illustrates a prior art circuit capable of delaying a clock signal prior to activating the sense amplifiers. Memory array 16 includes a series of word lines 20 arranged in rows and a series of bit lines 22 arranged in columns. Memory cells 24 are arranged in rows and columns within memory array 16. Sense amplifiers 18 are connected to bit lines 22 and provide amplified outputs 30. A delay simulation circuit 28 receives a clock signal on an input line 26 and generates a sense amplifier clock signal for activating sense amplifiers 18. The delay provided by simulation circuit 28 represents the worst case delay of a signal propagated through memory array 16. This delay assumes that a word line signal propagates across memory array 16 to the last possible bit line ($BL_n$), thereby representing the longest delay across the memory array. The delay circuit also includes a worst case delay for providing the memory cell data to the bit line and the propagation delay of the data to the sense amplifier. An additional delay is encountered as the clock signal is propagated from delay simulation circuit 28 to the appropriate sense amplifier 18. Delay simulation circuit 28 generally includes an additional delay to provide an extra time period to ensure that sense amplifiers 18 are not activated before the memory cell data is available. Thus, the circuit illustrated in FIG. 2 delays activation of the sense amplifiers for more than a worst case time period, thereby reducing the overall speed and efficiency of the memory device.

As shown in FIG. 2, the word line signal propagates from left to right. In contrast, the sense amplifier clock signal propagates from right to left. Therefore, in a worst case situation, a worst case delay is provided by delay simulation circuit 28 and an additional delay is provided by the propagation from circuit 28 to the leftmost sense amplifier 18. In this case, the data from memory cell 24 is available at the leftmost sense amplifier 18 for a significant period of time before the sense amplifier clock signal is received.

Further illustrated by FIG. 2, existing clock delay circuits are located within the memory device, but outside memory array 16. When designing memory devices, the area used by the memory array is minimized to reduce the chances of contaminants entering the array and rendering the memory device defective. Furthermore, new memory devices are continuously being designed to provide a greater amount of memory capacity in a single device. Designers attempt to provide a maximum number of individual memory cells within a particular memory array. Thus, the memory array is a "sacred" portion of the memory device, and is under continuous improvement to provide maximum storage capacity in a minimum memory array area. As a result, delay circuits such as circuit 28 in FIG. 2 are placed outside the memory array portion of the memory device.

SUMMARY OF THE INVENTION

The present invention overcomes the problems discussed above by providing a system for matching a clock delay to the delay through a memory array. The inventive system provides a clock line bused in parallel with the word lines to "match" the two signals. Therefore, the clock delay signal provided to the sense amplifiers is optimized such that the sense amplifier is activated immediately after the selected data is available to the sense amplifier. The present invention increases the speed of the memory device, even for the longest delay through the memory array.

One embodiment of the present invention provides a memory device having a memory array and a plurality of sense amplifiers coupled to the memory array. The memory array includes numerous memory cells. A clock transmission line forms a clock word line within the memory device and receives a clock signal. A circuit is coupled to the clock transmission line and includes at least one transistor device coupled to the clock transmission line to receive the clock signal. The circuit also includes a clock output coupled to one of the sense amplifiers.

A further aspect of the present invention provides a series of clock cells coupled to the sense amplifiers and arranged in parallel with word lines in the memory array. The clock cells have an associated clock signal delay substantially equal to the word line delay. A series of clock output lines are coupled together and coupled to one of the sense amplifiers.

Another feature of the present invention provides a clock transmission line located within the memory array.

One aspect of the present invention involves receiving a memory address and propagating a word line signal across a particular memory cell word line in response to the memory address. A clock signal is propagated across a series of clock cells at the same time a word line signal is propagated across a row of memory cells. A sense amplifier clock signal is generated when the clock signal arrives at a predetermined clock cell in the memory device. The sense amplifier clock signal activates a corresponding sense amplifier.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

The following detailed description sets forth numerous specific details to provide a thorough understanding of the present invention. However, those skilled in the art will appreciate that the present invention may be practiced without these specific details. In other instances, well known methods, procedures, components, and circuits have not been described in detail so as not to obscure the present invention.

The present invention provides a circuit for matching a clock signal delay to the delay through a memory array. Rather than using a circuit which delays the sense amplifier clock signal for a worst case time period, the present invention matches the clock signal delay to the delay through the memory array, thereby providing faster operation of the memory device.

Figure 3:
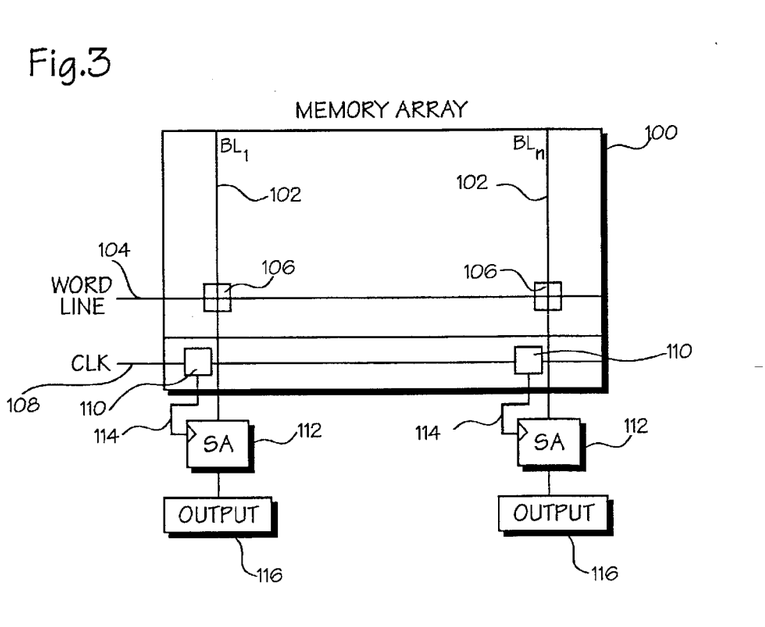
FIG. 3 illustrates a circuit used by the present invention to delay a sense amplifier clock signal.

Referring to FIG. 3, a first embodiment of the present invention is illustrated. A memory array 100 includes a plurality of bit lines 102 arranged in parallel with one another. A plurality of word lines 104 are also arranged in parallel with one another. A plurality of memory cells 106 are arranged into rows and columns. Each column of memory cells 106 is associated with a particular bit line 102 and each row of memory cells 106 is associated with a particular word line 104. By activating a particular word line 104 and selecting a particular bit line 102, a specific memory cell 106 is selected.

A clock transmission line 108 extends across memory array 100 in parallel with word lines 104, thereby forming a clock word line. Clock line 108 receives a clock signal for transmission across the memory array to a plurality of clock cells 110. Clock cells 110 are located within memory array 100 and connected to clock line 108. Clock cells 110 are arranged in a row parallel to the memory cell rows. A single clock cell 110 is provided for each memory cell column. Clock cells 110 do not actually store memory data, but rather provide a circuit for matching the propagation delay associated with memory cells 106. Each clock cell 110 includes a clock output line 114 which is coupled to a clock input of sense amplifier 112. Sense amplifier 112 receives a memory cell data signal on bit line 102 and generates an amplified version of the data signal at output 116.

The propagation delay across word line 104 will vary depending on the distance to the appropriate bit line. For example, the propagation delay to bit line $BL_1$ is substantially less than the propagation delay to bit line $BL_n$. Since word line 104 and clock line 108 are bused in the same direction, the signal on clock line 108 arrives at the particular clock cell 110 at the same time the signal on word line 104 arrives at memory cell 106. This configuration provides for parasitic matching between clock line 108 and word line 104. This parasitic matching provides similar parasitic capacitances and similar resistances on the two lines 104 and 108 because the lines follow similar geometries within memory array 100. Additionally, since clock cells 110 are located within the memory array, transistor matching is achieved due to a similar processing environment within the memory array.

The configuration illustrated in FIG. 3 permits faster operation of the memory device because the clock signal is not delayed for a worst case time period. Instead, the clock signal is delayed for a minimum time period and provided to the sense amplifier immediately after the data becomes available to the sense amplifier. Therefore, the sense amplifier is not waiting for a worst case time period to elapse when the memory cell data signal is already available to the sense amplifier.

Figure 4:
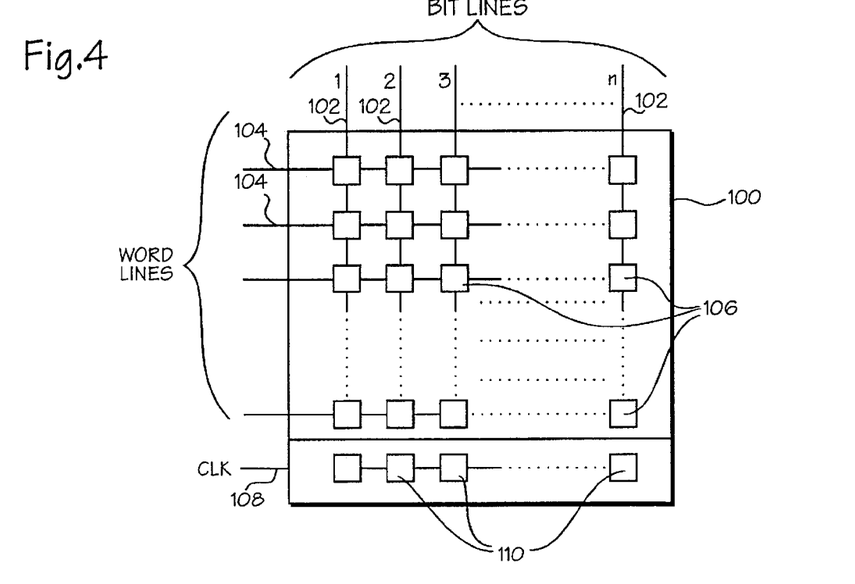
FIG. 4 is a diagram of a memory array incorporating the present invention.

Referring to FIG. 4, a diagram of memory array 100 is provided. As described above, a plurality of memory cells 106 are arranged into a plurality of rows and columns. A series of bit lines 102 are associated with each column of memory cells and a series of word lines 104 are associated with each row of memory cells 106. A clock line 108 is bused in parallel with word lines 104 within memory array 100. A single row of clock cells 110 is provided in parallel with the rows of memory cells 106. Therefore, the propagation characteristics of clock line 108 simulate the propagation characteristics of word lines 104. Similarly, each clock cell 110 has propagation characteristics similar to those of the memory cells 106. The signal propagated across word line 104 is transmitted in the same direction as the signal propagated across clock line 108. Thus, the word line signal arrives at the selected memory cell 106 simultaneously with the arrival of the clock line signal at the corresponding clock cell 110.

Figure 5:
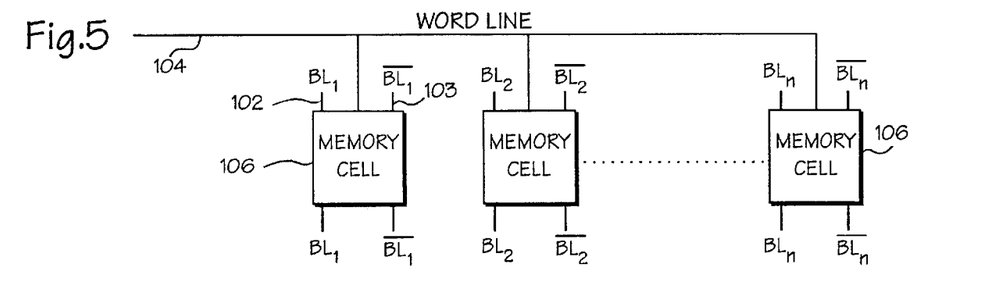
FIG. 5 is a block diagram of a row of memory cells.

FIG. 5 illustrates a block diagram of a row of memory cells 106. Word line 104 is connected to each memory cell 106 in the memory cell row. Similarly, bit lines 102 extend through each memory cell 106 in the particular memory cell column. An inverted bit line 103 provides the inverted version of the bit stored at the memory cell. Inverted bit line 103 is positioned in parallel with the non-inverted bit line 102 and extends through each memory cell in the particular memory cell column.

Figure 6:
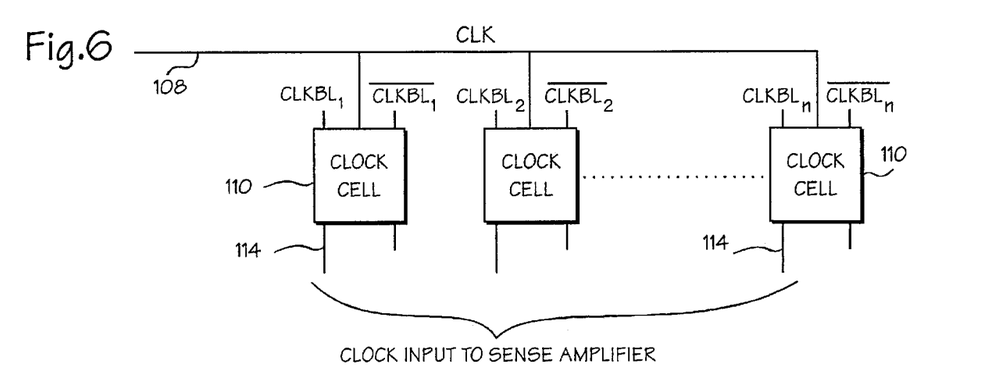
FIG. 6 is a block diagram of a row of clock cells according to the present invention.

Referring to FIG. 6, a block diagram of a row of clock cells 110 according to the present invention is provided. Clock line 108 is connected to each clock cell 110. Each clock cell includes a clock bit line and an inverted clock bit line. Clock bit line 114 from clock cell 110 is used to provide the clock signal to the sense amplifiers within the memory device. Only the non-inverted version of the clock bit line is used by the present invention.

Figure 7:
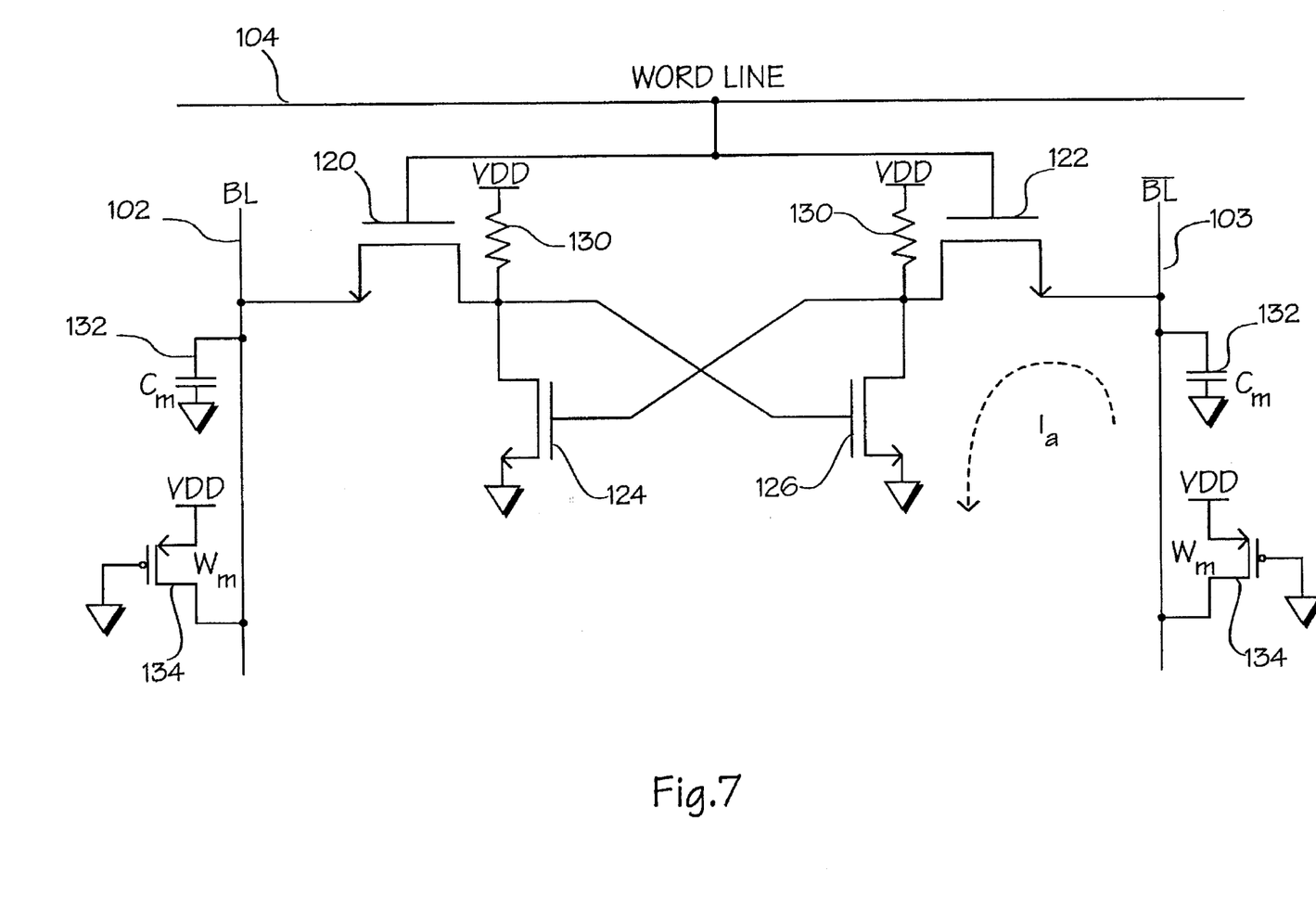
FIG. 7 is a schematic diagram of a single memory cell.

FIG. 7 illustrates a schematic diagram of a single memory cell 106. Word line 104 is connected to the gate of transistors 120 and 122. The source of transistor 120 is connected to bit line 102 and the source of transistor 122 is connected to inverted bit line 103. The drain of transistor 120 is connected to the gate of a transistor 126. The drain of transistor 122 is connected to the gate of a transistor 124. The source of each transistor 124 and 126 is connected to ground while the drain of each transistor is pulled high through resistor 128 and 130, respectively. The drain of transistor 122 is connected to the drain of transistor 126. Similarly, the drain of transistor 120 is connected to the drain of transistor 124. The circuit illustrated in FIG. 7 is a conventional memory cell operating in a conventional manner. A pair of transistors 134 are optional components, common among a column of memory cells 106 of FIG. 4, and permit precharging of the bit lines. A pair of capacitors 132 are representative of capacitance contributed by memory cells 106 in a column of FIG. 4 and are coupled to bit lines 102 and 103 as shown. Bit line 102 and inverted bit line 103 are connected to other memory cells in the same memory cell column. Similarly, word line 104 is connected to other memory cells in the same memory cell row.

Figure 8:
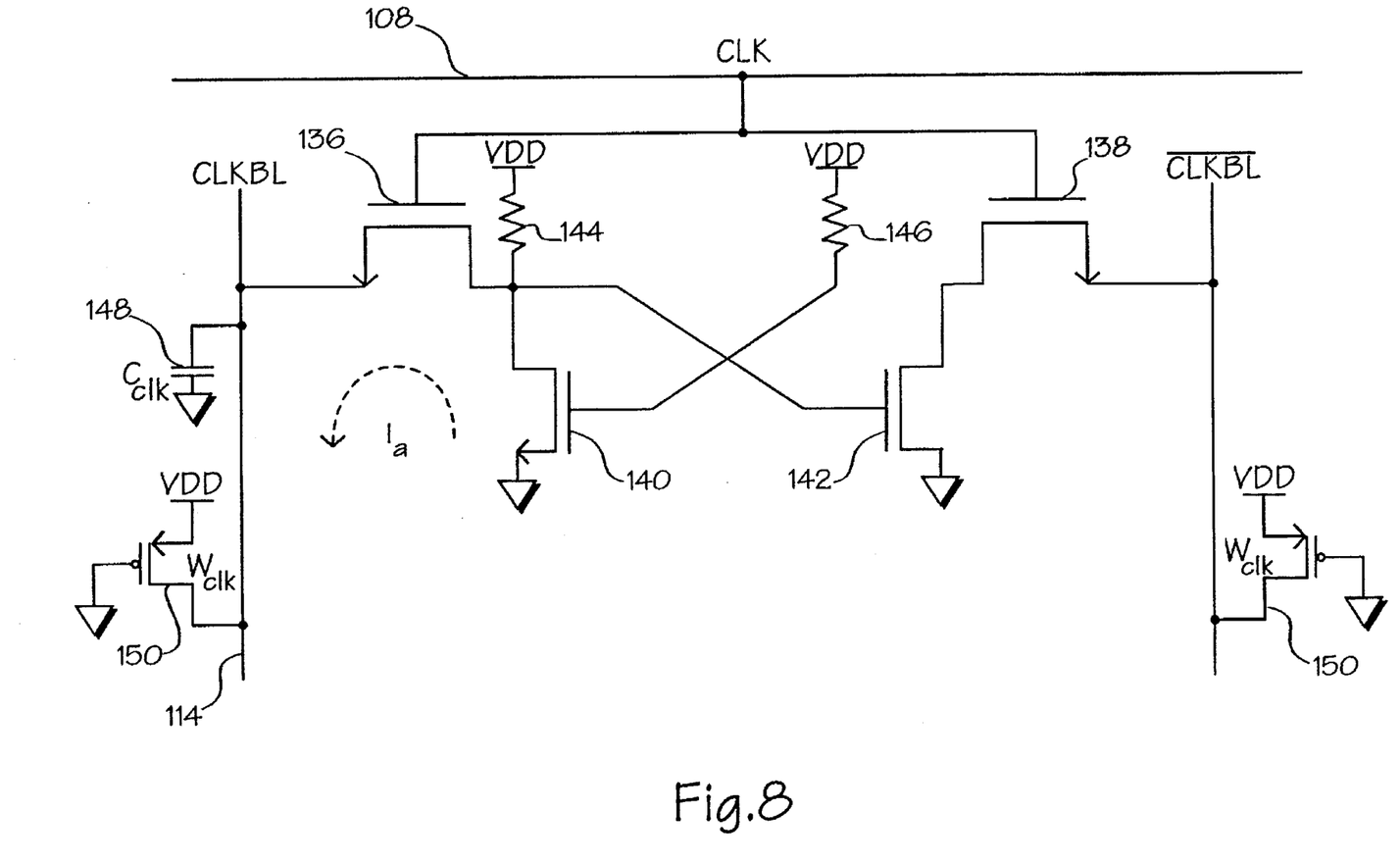
FIG. 8 is a schematic diagram of a single clock cell.

FIG. 8 illustrates a schematic diagram of a single clock cell as used with the present invention. The overall structure of the clock cell illustrated in FIG. 8 is similar to that of the memory cell illustrated in FIG. 7. Clock line 108 is connected to the gate of transistors 136 and 138. The source of transistor 136 is connected to the clock bit line and the source of transistor 138 is connected to the inverted clock bit line. The drain of transistor 136 is connected to the gate of a transistor 142 and the drain of transistor 138 is connected to the drain of transistor 142. A transistor 140 has a gate pulled high through resistor 146 and a drain pulled high through resistor 148. The source of each transistor 140 and 142 is connected to ground. The drain of transistor 136 is connected to the drain of transistor 140. A pair of transistors 150 permit the precharging of the clock bit lines and are common among clock cells 110 of FIG. 4. Capacitor 148 is representative of the capacitance contributed by each clock cell 110 to clock bit line 114 in the row of clock cells 110 shown in FIG. 4. The connections illustrated in FIG. 8 are similar to the connections described above with respect to FIG. 7. This similarity in circuit structure between the clock cell and the memory cell provides propagation delays through clock cell 110 which are similar to the propagation delays through memory cell 106. Since clock cells 110 are not used to store actual memory data, the circuit configuration shown in FIG. 8 always stores a zero in the clock cell.

The circuit illustrated in FIG. 8 is one example of a clock cell for use with the present invention. However, other types of "clock cells" may be used to practice the invention. Other types of clock cells include any circuit capable of matching the delay of a clock signal to the delay of a signal propagating through the memory array. For example, the clock cell may be a driver having a delay matched to the delay of a signal propagating through the memory array.

Figure 9:
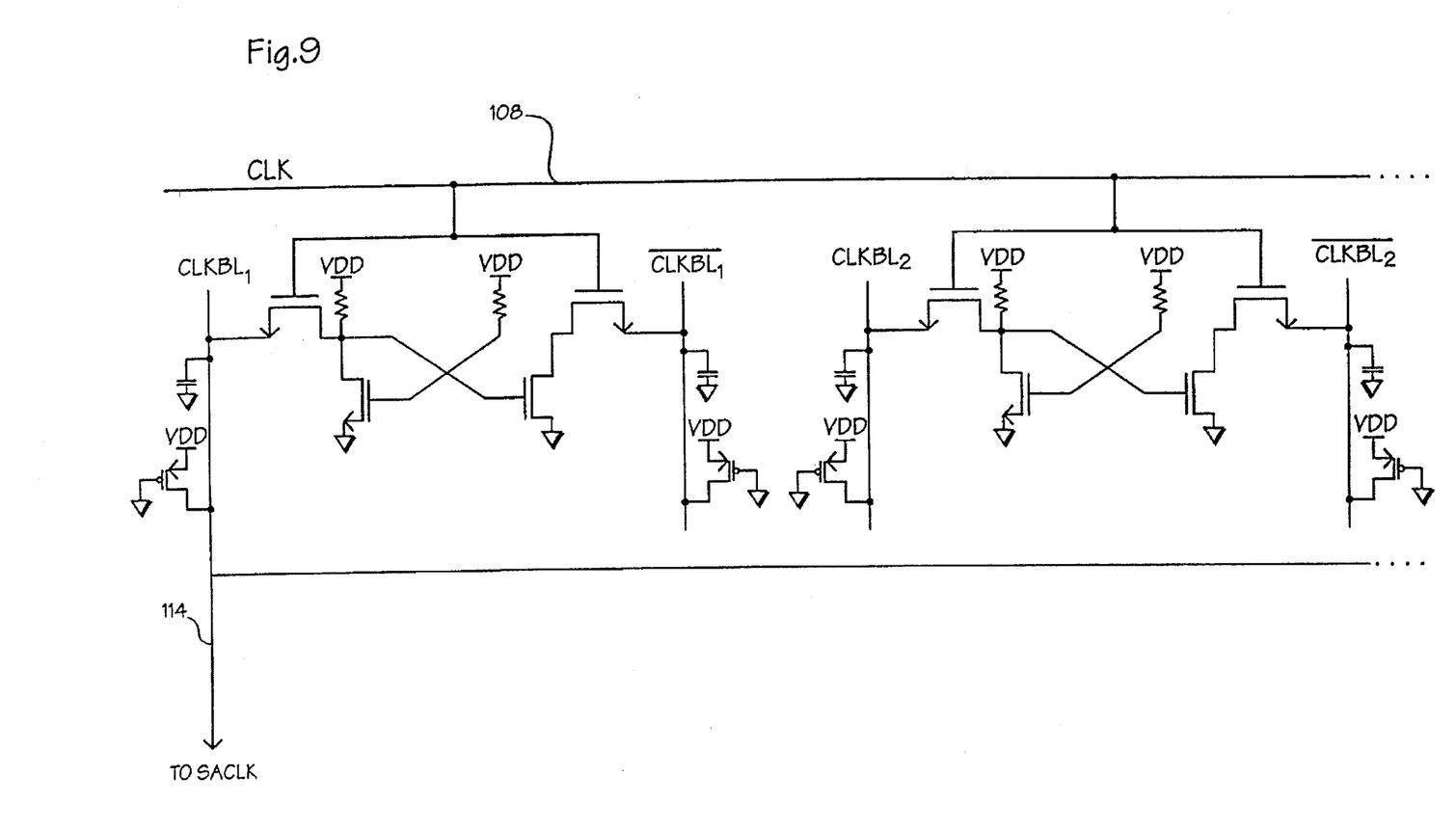
FIG. 9 is a schematic diagram of a series of clock cells.

FIG. 9 illustrates the connection of a pair of adjacent clock cells 110. Clock line 108 is connected to each clock cell 110 and the clock bit lines are coupled together to generate a sense amplifier clock signal on line 114. As discussed above, the clock bit line (CLKBL) and the inverted clock bit line are not coupled to memory cell bit lines 102 or 103. Instead, the clock bit lines are coupled together as shown in FIG. 9 to generate the sense amplifier clock signal.

Figure 10:
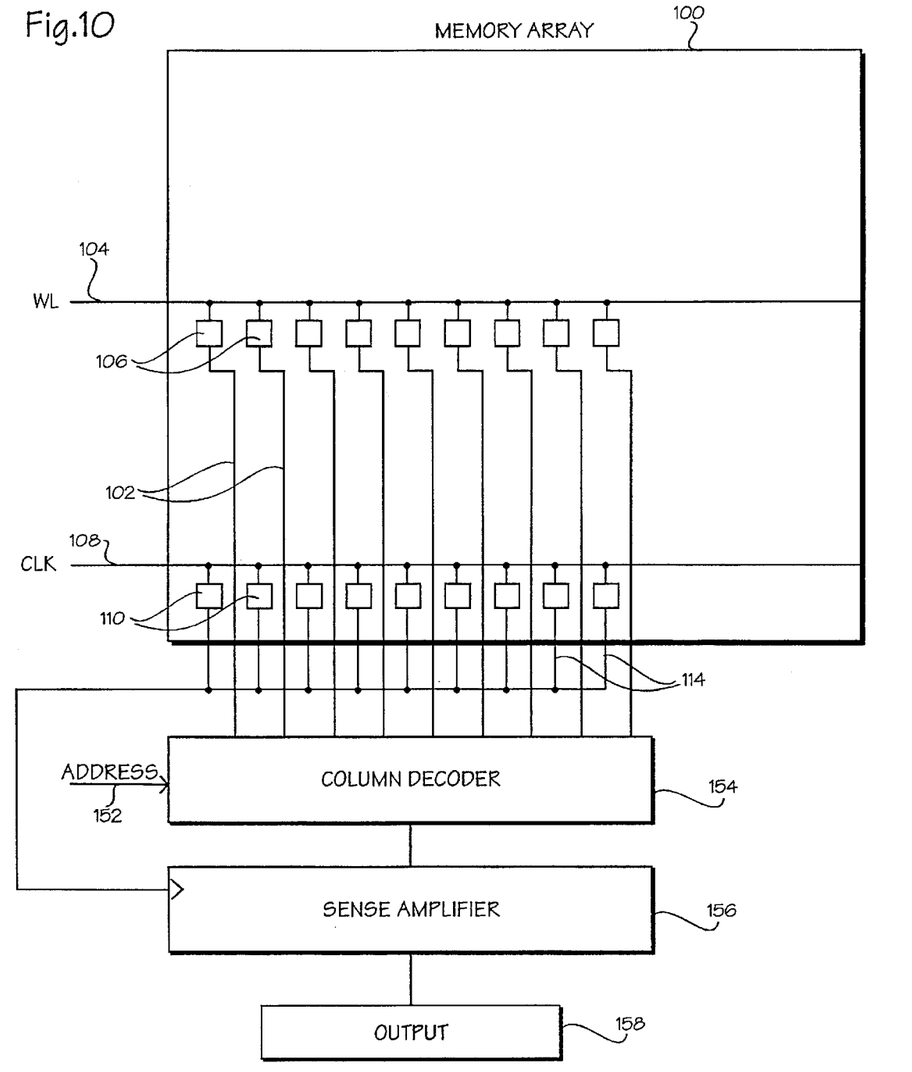
FIG. 10 is a block diagram illustrating the connections between the clock cells, memory array, and sense amplifiers.

Referring to FIG. 10, a block diagram illustrates the connections between clock cells 110, memory cells 106, a column decoder 154, and a sense amplifier 156. Bit lines 102 and 103 from each memory cell 106 are connected to column decoder 154 which receives a memory address on address line 152. The output of column decoder 154 is connected to the input of sense amplifier 156. Sense amplifier 156 amplifies the signal from column decoder 154 and provides the amplified signal to output 158. As illustrated, eight clock cell output lines 114 are coupled together and coupled to the clock input of sense amplifier 156. These clock cell output lines 114 are coupled together to generate a voltage level sufficient to activate sense amplifier 156. Each clock cell 110 provides an output voltage of approximately 60 mV. However, sense amplifier 156 requires a clock input voltage at the CMOS level. Therefore, several clock cell outputs are connected together to provide the appropriate signal to the sense amplifier. FIG. 10 illustrates eight clock cells 110 connected to one another, but this number will vary depending on the particular application. In a particular embodiment of the present invention, sixty four clock cell outputs 114 are coupled together and coupled to nine sense amplifier clock inputs.

The number of clock cell output lines 114 required for a particular application may be determined by comparing the slew rate of the memory cell 106 to the slew rate of clock cell 110 to determine the gain produced by the clock cell output lines. This same equation may be used to determine the number of clock cells required to produce a particular gain. The slew rates are compared using the following formula:

$$\text{Gain} = \frac{S_{clk}}{S_m} = \frac{C_{clk}}{C_m} \cdot \frac{W_{clk}}{W_m} \cdot \frac{m \cdot I_a}{I_a}$$

Where $C_{clk}$ represents the value of capacitor 148 in FIG. 8 and $C_m$ represents the value of capacitors 132 in FIG. 7. Similarly, $W_{clk}$ represents the width associated with transistors 150 (FIG. 8) and $W_m$ represents the width associated with transistors 134 (FIG. 7). Variable m represents the number of clock cell output lines 114 coupled together. Finally, $I_a$ represents the current illustrated in FIGS. 7 and 8. Thus, a known value for m permits calculation of the gain produced by clock cell output lines 114. Similarly, a known value for the gain permits calculation of the number (m) of clock cell output lines 114 required to achieve the desired gain.

Figure 11:
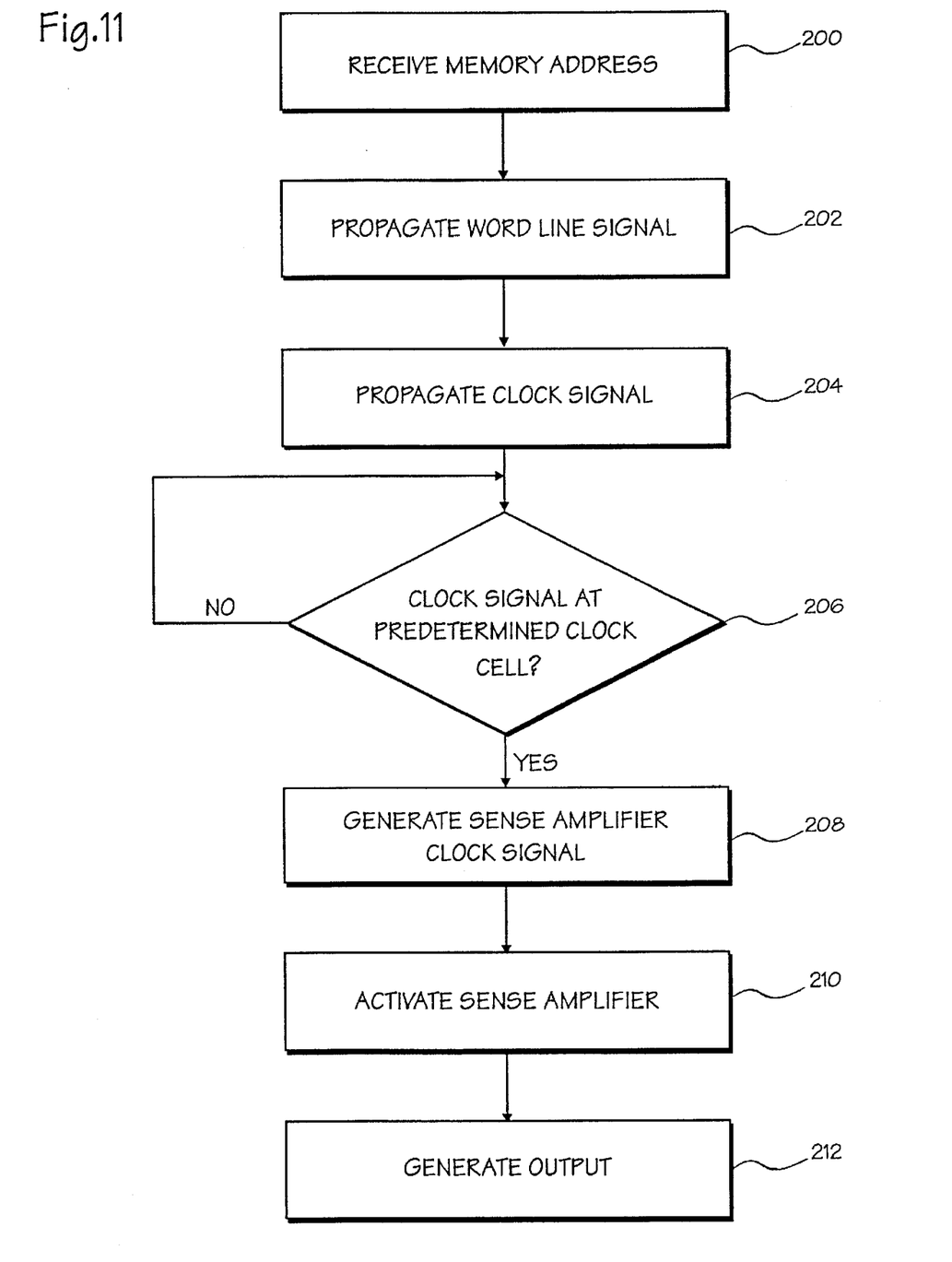
FIG. 11 is a flow diagram illustrating operation of the present invention.

Referring to FIG. 11, a flow diagram illustrates the overall operation of the present invention. At step 200, a memory address is received by the memory device. This memory address is used to activate the appropriate word line through the memory array. Additionally, the memory address is used by the column decoder to retrieve data from the appropriate bit line. At step 202, a word line signal is propagated across the appropriate word line in the memory array. At step 204, a clock signal is propagated across the clock line simultaneous with the propagation of the word line signal across the word line. Step 206 determines whether the clock signal has arrived at the predetermined clock cell; i.e., the clock cell corresponding to the specified bit line. Since the clock line follows a path similar to the path followed by the word line, the clock line signal arrives at the appropriate clock cell at the same time the word line signal arrives at the appropriate memory cell.

In step 206, if the clock signal has not arrived at the appropriate clock cell, the routine continues to test for that same condition. If the clock signal has arrived at the appropriate clock cell, step 208 generates a sense amplifier clock signal. As illustrated above, multiple clock cell outputs are coupled together to generate the sense amplifier clock signal. The sense amplifier clock signal activates the sense amplifier at step 210 to receive the memory data provided on the selected bit line. At step 212, the sense amplifier generates an amplified output signal representing the memory data.

In summary, the clock signal activates the appropriate sense amplifier immediately after the memory data is available on the bit line coupled to the sense amplifier. Thus, the present invention does not wait for a worst case time period before activating the sense amplifier. The time delay between arrival of valid data at the sense amplifier and activation of the sense amplifier is minimized to increase the overall speed of the memory device.

The above description and drawings illustrate a series of clock cells positioned within the memory array itself. In an alternate embodiment, clock cells 110 may be located outside the memory array. For example clock cells 110 may be positioned between the memory array and the sense amplifiers or between the output drivers and the sense amplifiers. Clock line 108 is also located outside the memory array and is routed in parallel with word lines 104. Similarly, the clock signal is transmitted along clock line 108 in the same direction as the word line signal.

From the above description and drawings, it will be understood by those skilled in the art that the particular embodiments shown and described are for purposes of illustration only and are not intended to limit the scope of the invention. Those skilled in the art will recognize that the invention may be embodied in other specific forms without departing from its spirit or essential characteristics. References to details of particular embodiments are not intended to limit the scope of the claims.

What is claimed is:

1. A memory device including a memory array having a plurality of memory cells including a first memory cell coupled to a first word line and a plurality of sense amplifiers coupled to said memory array, said memory device comprising:
   a clock transmission line coupled to receive a clock signal, said clock transmission line forming a clock word line; and
   a circuit coupled to said clock transmission line, wherein said circuit includes at least one transistor device coupled to said clock transmission line to receive said clock signal and includes a clock output coupled to one of said sense amplifiers:
   wherein said clock word line is configured to delay said clock signal so that said clock signal arrives at said circuit at the same time as a signal on said word line arrives at said first memory cell.

2. The memory device of claim 1 wherein said clock transmission line is disposed within said memory array.

3. The memory device of claim 1 wherein said clock transmission line is disposed between said memory array and said sense amplifiers.

4. The memory device of claim 1 wherein a plurality of said circuits are coupled between said clock transmission line and said sense amplifiers.

5. The memory device of claim 1 wherein a plurality of said clock outputs are coupled together and coupled to one of said sense amplifiers.

6. A memory device including a memory array having a plurality of memory cells arranged in a plurality of memory cell word lines, said memory cell word lines having an associated word line delay, said memory device comprising:
   a plurality of sense amplifiers coupled to said memory array; and
   a plurality of clock cells coupled to said sense amplifiers, said clock cells arranged in parallel with said memory cell word lines and coupled to receive a clock signal, said clock cells having an associated clock signal delay substantially equal to said associated word line delay.

7. The memory device of claim 6 wherein each sense amplifier includes a clock input and said clock cells are coupled to said clock input.

8. The memory device of claim 7 wherein each clock cell includes an output line, and wherein a plurality of said clock cell output lines are coupled together and coupled to said clock input of one of said sense amplifiers.

9. The memory device of claim 6 wherein each of said memory cells has an associated memory cell delay, and each of said clock cells has an associated clock cell delay substantially equal to said memory cell delay.

10. The memory device of claim 6 wherein one of said clock cells is provided to correspond with each memory cell in said word line.

11. The memory device of claim 6 further including a plurality of column decoders coupled between said memory cells and said sense amplifiers.

12. The memory device of claim 6 wherein said clock cells are disposed within said memory array.

13. A memory device including a memory array having a plurality of memory cells arranged in a plurality of memory cell columns, each memory cell having an associated memory cell delay, said memory device comprising:
   a plurality of sense amplifiers coupled to said memory array; and
   a plurality of clock cells disposed within said memory array and coupled to said sense amplifiers, each clock cell associated with a particular memory cell column and coupled to receive a clock signal, each clock cell having an associated clock cell delay substantially equal to said associated memory cell delay.

14. The memory device of claim 13 wherein each sense amplifier includes a clock input and said clock cells are coupled to said clock input.

15. The memory device of claim 14 wherein each clock cell includes an output line, and wherein a plurality of said clock cell output lines are coupled together and coupled to said clock input of one of said sense amplifiers.

16. The memory device of claim 13 further including a plurality of column decoders coupled between said memory cells and said sense amplifiers.

17. The memory device of claim 13 wherein said clock cells are disposed within said memory array.

18. In a memory device having a memory array and a plurality of sense amplifiers coupled to said memory array, said memory array including a plurality of memory cells arranged in a plurality of memory cell word lines and a plurality of clock cells arranged in parallel with said memory cell word lines, a method for matching a clock signal delay to a word line delay in said memory device, said method comprising the steps of:
   receiving a memory address;
   propagating a word line signal across a particular memory cell word line in response to said memory address;
   propagating a clock signal across said plurality of clock cells simultaneously with propagating said word line signal; and
   generating a sense amplifier clock signal when said clock signal arrives at a predetermined clock cell in said memory array for activating said sense amplifier.

19. The method of claim 18 wherein said predetermined clock cell is associated with a selected bit line in said memory array.

20. The method of claim 18 wherein each sense amplifier includes a clock input for receiving said sense amplifier clock signal.

21. The method of claim 18 wherein each clock cell includes an output line, a plurality of said clock cell output lines being coupled together for generating said sense amplifier clock signal.

* * * * *